United States Patent
Sanchez

(10) Patent No.: US 10,729,021 B1
(45) Date of Patent: Jul. 28, 2020

(54) CAPPED ELECTRONIC CONTROL UNIT

(71) Applicant: VEONEER US INC., Southfield, MI (US)

(72) Inventor: Luis Fernando Sanchez, Commerce Township, MI (US)

(73) Assignee: VEONEER US INC., Southfiels, MI (US)

( * ) Notice: Subject to any disclaimer, the term of this patent is extended or adjusted under 35 U.S.C. 154(b) by 0 days.

(21) Appl. No.: 16/293,085

(22) Filed: Mar. 5, 2019

(51) Int. Cl.
| | | |
|---|---|---|
| *H05K 7/00* | (2006.01) |
| *H05K 5/00* | (2006.01) |
| *H01R 12/72* | (2011.01) |
| *H01R 13/502* | (2006.01) |
| *H01R 13/66* | (2006.01) |
| *B60R 16/023* | (2006.01) |
| *H01R 13/52* | (2006.01) |
| *H05K 7/14* | (2006.01) |

(52) U.S. Cl.
CPC ....... *H05K 5/0026* (2013.01); *B60R 16/0239* (2013.01); *H01R 12/721* (2013.01); *H01R 13/502* (2013.01); *H01R 13/5202* (2013.01); *H01R 13/6658* (2013.01); *H05K 7/1427* (2013.01); *H01R 2201/26* (2013.01); *H05K 2201/10189* (2013.01)

(58) Field of Classification Search
USPC ................ 361/728, 752, 800, 807, 809, 810
See application file for complete search history.

(56) References Cited

U.S. PATENT DOCUMENTS

| | | | | |
|---|---|---|---|---|
| 4,550,962 A * | 11/1985 | Czeschka | ............. | H01R 12/585 439/78 |
| 5,266,054 A * | 11/1993 | Duncan | .............. | H01R 13/5219 439/559 |
| 8,627,564 B2 * | 1/2014 | Blossfeld | ............... | H01R 12/00 29/883 |
| 8,770,989 B2 * | 7/2014 | Ohhashi | ............... | H05K 5/0069 439/589 |
| 2013/0313753 A1 * | 11/2013 | Scheel | ............. | B29C 45/14549 264/272.14 |
| 2017/0054233 A1 * | 2/2017 | Kikuchi | ............... | H01R 12/585 |

FOREIGN PATENT DOCUMENTS

CN   106143377   11/2016   ............. B60R 21/01

* cited by examiner

*Primary Examiner* — Hung S. Bui
(74) *Attorney, Agent, or Firm* — Christopher P. Maiorana, PC

(57) ABSTRACT

An apparatus includes a housing, a connector, a circuit board and a cap. The housing may have a first opening, a second opening and a third opening. The connector (i) may be configured to seal the first opening of the housing and (ii) may have one or more pins. The circuit board (i) may be disposed inside the housing and (ii) may have one or more vias configured to receive the pins. The second opening may be configured to transfer the circuit board into the housing. The third opening may be configured to receive a comb tool that presses the pins into the vias. The comb tool may be removed from the third opening after the pins are disposed in the vias. The cap may be configured to seal the third opening.

20 Claims, 14 Drawing Sheets

CAPPED ELECTRONIC CONTROL UNIT

FIELD OF THE INVENTION

The invention relates to automotive control assemblies generally and, more particularly, to a method and/or apparatus for implementing a capped electronic control unit.

BACKGROUND

Manufacturers commonly specify sealing levels for fully assembled electronic modules. One or more connectors are conventionally included on the electronic modules to make electrical contact between printed circuit boards within the modules and vehicle harnesses outside the modules. Possible leak paths between the connectors and electronic module housings are commonly sealed with dispensed seals or gaskets.

Current electronic module designs use plastic housings and bases or a rubber gasket to seal the housings. The electronic modules also use potting or bonding components outside the housings to fill gaps. The design approaches are expensive and have other shortcomings.

It would be desirable to implement a capped electronic control unit.

SUMMARY

The invention concerns an apparatus including a housing, a connector, a circuit board and a cap. The housing may have a first opening, a second opening and a third opening. The connector (i) may be configured to seal the first opening of the housing and (ii) may have one or more pins. The circuit board (i) may be disposed inside the housing and (ii) may have one or more vias configured to receive the pins. The second opening may be configured to transfer the circuit board into the housing. The third opening may be configured to receive a comb tool that presses the pins into the vias. The comb tool may be removed from the third opening after the pins are disposed in the vias. The cap may be configured to seal the third opening.

BRIEF DESCRIPTION OF THE FIGURES

Embodiments of the invention will be apparent from the following detailed description and the appended claims and drawings in which:

DETAILED DESCRIPTION OF THE EMBODIMENTS

Embodiments of the present invention include providing a capped electronic control unit that may (i) be cost effective, (ii) accommodate connectors from multiple suppliers, (iii) accommodate different connector types, (iv) seal the connectors to the housing, (v) use connectors free from any special manufacturing process or complex designs, (vi) accommodate tools that properly locate the connectors to the housing, (vii) allow support of a printed circuit board during compliant pin insertion, (viii) minimize a risk of under insertion of the compliant pins, (ix) provide a completely sealed unit and/or (x) be assembled without screws.

In various embodiments, a connector and a cap may be welded or adhered to a plastic housing to close all potential openings to the housing. A printed circuit board may be assembled to compliant pins of the connector while the printed circuit board is located inside the housing. The opening for the cap and the opening for the printed circuit board generally allow for assembly tools to be used to locate the connector properly to the housing while the connector is being welded. The cap opening may also be useful during the insertion of the printed circuit board because a comb tool may be used to support the compliant pins during assembly. Once the cap is welded to the housing, and the cover or baseplate are assembled with a seal gasket or laser welded to the housing, the electronic control unit may be completely sealed.

Figure 1:
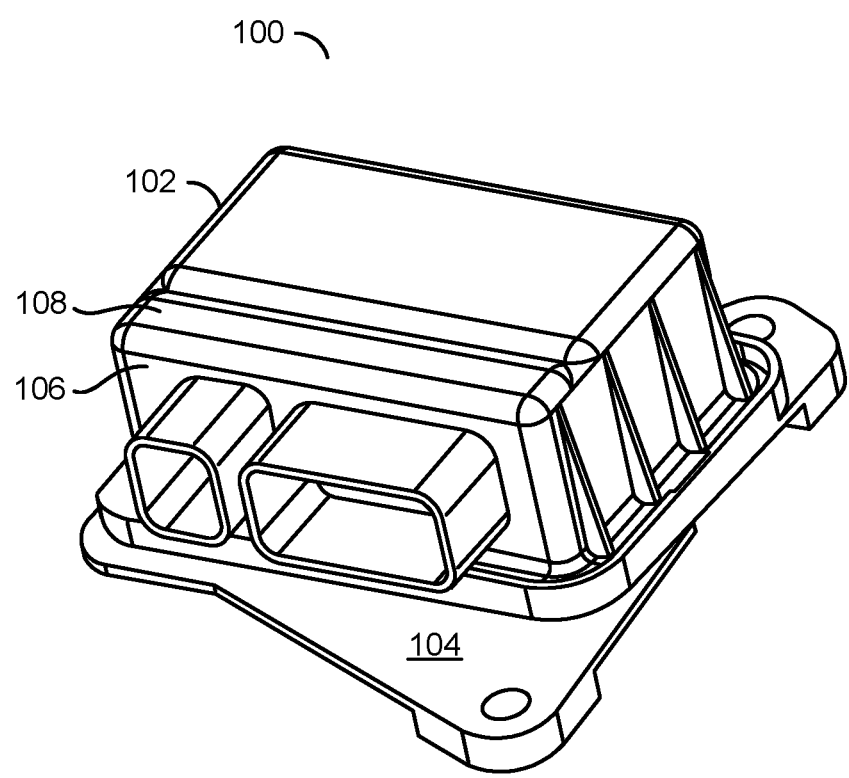
FIG. 1 is a diagram illustrating a perspective view of an apparatus in accordance with an example embodiment of the invention.

Referring to FIG. 1, a diagram is shown illustrating a perspective view of an apparatus 100 in accordance with an example embodiment of the invention. In various embodiments, the apparatus 100 may implement an electronic control unit (or module). The apparatus 100 generally comprises an upper housing 102, a lower housing (or floor or baseplate) 104, a connector 106 and a cap (or cover) 108.

The upper housing 102 may be implemented as a nonconductive enclosure. While mated with the lower housing 104, the connector 106 and the cap 108, the upper housing 102 may configured to provide an environmentally sealed enclosure. The enclosure may protect components and devices mounted inside the apparatus 100. The upper housing 102 generally comprises a plastic or resin-based material. In various embodiments, the plastic material may include, but is not limited to polyamide (NYLON), polybutylene terephthalate (PBT), polypropylene, polyethylene terephthalate (PET), acrylonitrile butadiene styrene (ABS), and/or various alloys and/or fillers of the resins. Other materials may be implemented to meet the design criteria of a particular application.

The lower housing 104 may be implemented as an electrically conductive baseplate. The baseplate 104 is generally configured to provide mechanical support, thermal cooling and electrical grounding for the apparatus 100. In various embodiments, the baseplate 104 may comprise a die-cast Aluminum baseplate. In another example, the baseplate 104 may be implemented as a stamped steel baseplate. Implementing the baseplate 104 with a metallic material may aid in dissipating heat generated by circuitry within the apparatus 100. The baseplate 104 is generally configured to provide a mounting footprint for the apparatus 100. In an example, the baseplate 104 may be implemented with a three feet configuration to simplify testing. However, other footprint configurations may be implemented to meet the design criteria of a particular application. The baseplate 104 may include multiple (e.g., more than two) holes used to secure the apparatus 100 in place within a vehicle (or structure). In one example, the electrically conductive feature of the baseplate 104 may allow the electrical path from the printed circuit board through a contact spring to continue to the vehicle structure and finally to a vehicle power ground. In another example, the electrically conductive feature of the baseplate 105 may allow the electrical path from the printed circuit board through a contact point to continue to the vehicle structure and finally a vehicle power ground.

The connector (or electrical assembly) 106 may implement an electronic interface of the apparatus 100. The connector 106 may be operational to pass multiple electrical signals into and/or out of the apparatus 100. The electrical functions may include, but are not limited to, providing grounding paths for all electrical components inside the apparatus 100 to the exterior of the apparatus 100 and/or transfer electrical inputs from different circuits in the vehicle to electronic components mounted inside the apparatus 100. In various embodiments, the connector 106 generally comprises a plate having one or more integrated connectors attached to one or more printed circuit boards. The plate may be shaped to cover a side of the assembly 100 while secured to the upper housing 102. Additional details about the apparatus 100 may be found in co-pending U.S. patent application Ser. No. 15/924,896, filed Mar. 19, 2018, which is hereby incorporated by reference in its entirety.

Figure 2:
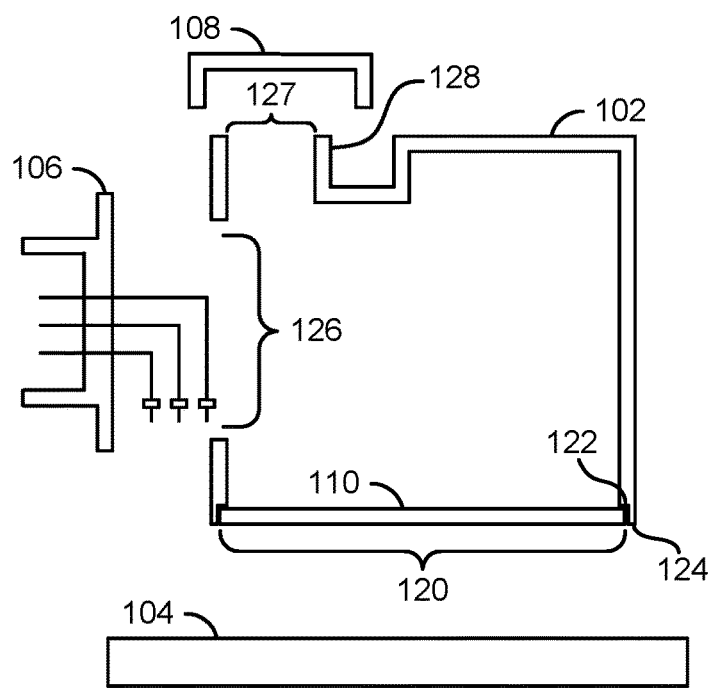
FIG. 2 is a diagram illustrating a cross-sectional view of the apparatus during assembly in accordance with an example embodiment of the invention.

Referring to FIG. 2, a diagram illustrating a cross-sectional view of the apparatus 100 during assembly is shown in accordance with an example embodiment of the invention. The apparatus 100 generally comprises the upper housing 102, the baseplate 104, the connector 106 and the cap 108. The upper housing 102 may include an open side 120, a shelf 122, a flange 124, a connector opening 126, a tool opening 127 and a rim 128. During assembly, the upper housing 102 may be inverted (relative to FIG. 1) such that the open side 120 is facing upward.

A printed circuit board 110 may reside inside the upper housing 102 on the shelf 122. A size and shape of the connector 106 may be designed to cover the connector opening 126. A size and shape of the baseplate 104 may be designed to cover the open end 120. The cap 108 may have a size and shape that covers the tool opening 127.

Figure 3:
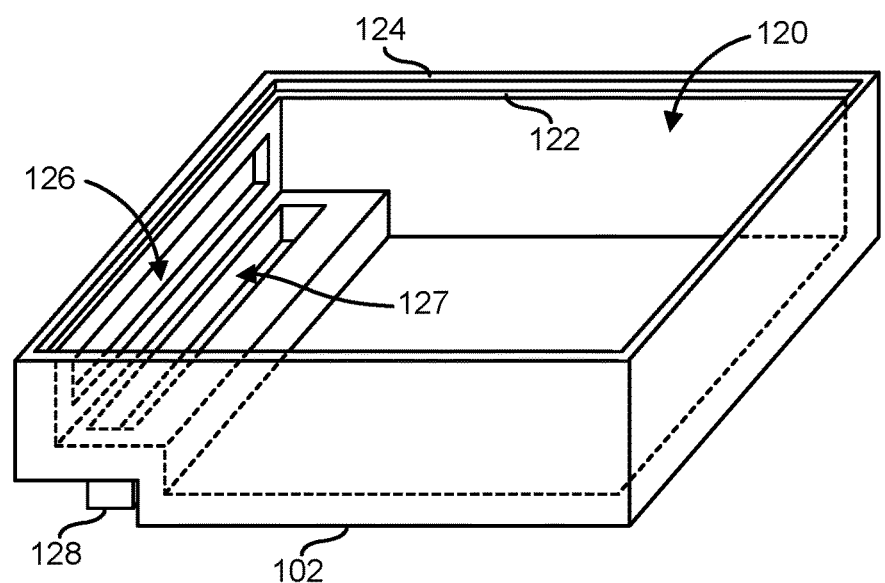
FIG. 3 is a diagram illustrating an upper housing of the apparatus in accordance with an example embodiment of the invention.

Referring to FIG. 3, a diagram illustrating an implementation of the upper housing 102 is shown in accordance with an example embodiment of the invention. The upper housing 102 is generally configured as a multi-sided (e.g., five-sided) enclosure. A side of the upper housing 102 that may neighbor the baseplate 104 may be the open side 120. A side of the upper housing 102 that may accept the connector 106 may include the connector opening 126. The open side 120 and the connector opening 126 may be on adjoining sides. A side of the upper housing 102 opposite the open side 120 may have the tool opening 127. In various embodiments, the side of the upper housing 102 having the tool opening 127 and the side of the upper housing 102 having the connector opening 126 may be adjoining sides. The other three sides of the upper housing 102 may form the closed sides of the enclosure.

The shelf 122 may be established on the four closed sides adjoining the open side 120. The shelf 122 may be disposed inside the upper housing 102. The shelf 122 may be configured to receive the printed circuit board 110.

The flange 124 may be created in the four close sides adjoining the open side 120. An outer surface of the flange 124 may be planar to mate to the baseplate 104. A height of the flange 124 may be larger than a thickness of the printed circuit board 110 and any of the compliant pins (or wires) of the connector 106 that protrude through the printed circuit board 110.

The connector opening 126 may be shaped to receive a plate of the connector 106. In various embodiments, the plate of the connector 106 may be configured to completely cover the connector opening 126 in the upper housing 102.

The rim 128 may be formed in the upper housing 102 around the tool opening 127. The rim 128 is generally rectangular in shape with a major axis running parallel to the connector opening 126. The rim 128 may be sized to be sealed by the cap 108.

Figure 4:
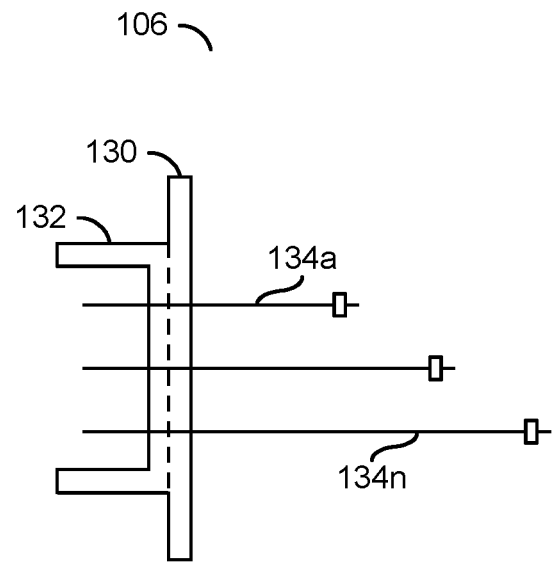
FIG. 4 is a diagram illustrating a cross-sectional view of a connector in accordance with an example embodiment of the invention.

Referring to FIG. 4, a diagram illustrating a cross-sectional view of the connector 106 is shown in accordance with an example embodiment of the invention. The connector 106 generally comprises a plate 130, a shroud 132 and multiple pins 134a-134n. In various embodiments, the plate 130 may be formed as an integral part of the connectors 106 to ensure a sealed surface. In other embodiments, the plate 130 may be formed separate from the connectors 106 and subsequently joined together as part of the connectors 106. The pins 134a-134n may provide multiple electrical connections between the pins and/or sockets of the connectors 106 and the printed circuit board 110.

In an example embodiment, the connectors 106 generally comprise a 72-pin connector and a 52-pin connector to provide electrical connections to the printed circuit board 110. In an example, the connectors 106 may be implemented as 1.8 mm pitch Nano connectors. Other numbers of connectors, other numbers of pins and/or other numbers of sockets may be implemented to meet the design criteria of a particular application.

Figure 5:
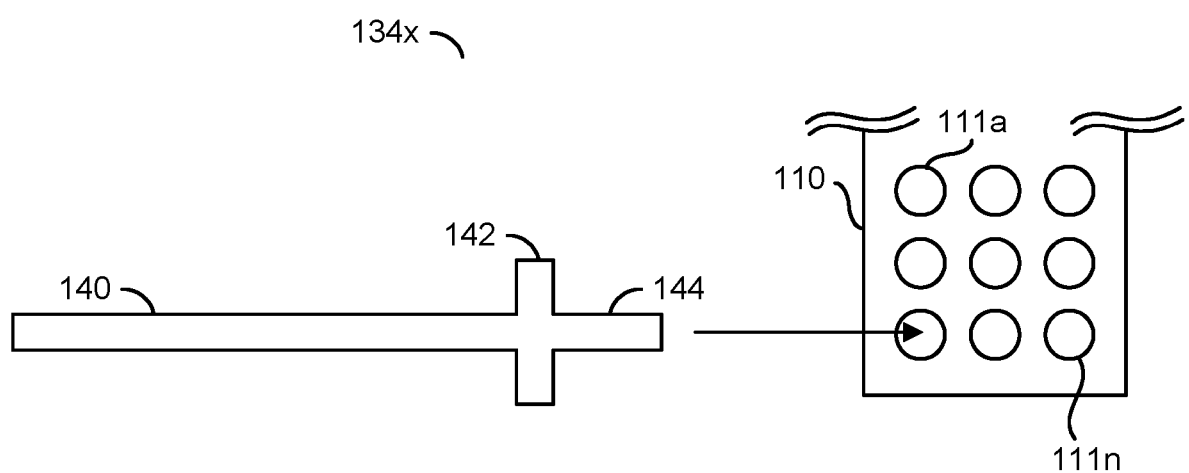
FIG. 5 is a diagram illustrating a pin and a portion of a printed circuit board in accordance with an embodiment of the invention.

Referring to FIG. 5, a diagram illustrating a pin 134x and a portion of the printed circuit board 110 are shown in accordance with an embodiment of the invention. The pin 134x may be representative of each pin 134a-134n. The pin 134x generally comprises a shaft 140, a "T" section 142 and a tip 144. The T section 142 may be located near the tip 144. The shaft 140 may be bent at an angle (e.g., approximately 90 degrees) after being sewed into the connector 106. In various embodiments, the shaft 140 is bent before being inserted through the connector opening 126 (e.g., see FIG. 2). In other embodiments, the shaft 140 may be bent after being inserted through the connector opening 126 (e.g., see FIGS. 11 and 12). The printed circuit board 110 may include multiple vias 111a-111n. In various embodiments, each via 111a-111n corresponds to a single pin 134a-134n.

Figure 6:
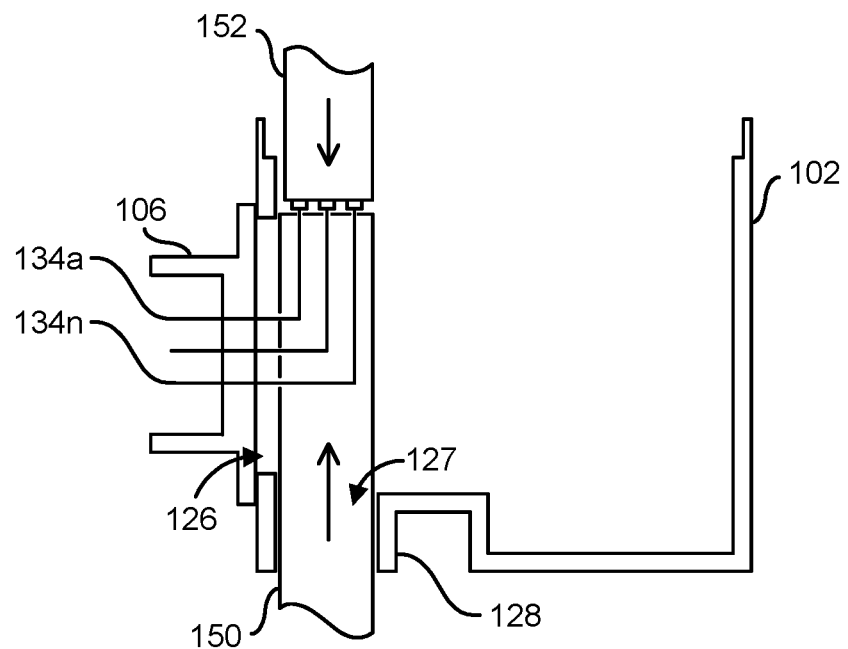
FIG. 6 is a diagram illustrating tools used to align the connector in accordance with an example embodiment of the invention.

Referring to FIG. 6, a diagram illustrating tools used to align the connector 106 is shown in accordance with an example embodiment of the invention. In the example, multiple (e.g., two) tools (or devices) 150 and 152 are illustrated.

The tool 150 may implement a comb tool. The comb tool 150 is generally operational to engage the T sections 142 of the pins 134a-134n at a position where the printed circuit board 110 may later be installed. For example, the T sections 142 may not move. The comb tool 150 is generally inserted into the assembly 100 through the tool opening 127. The comb tool 150 may stop when touching the T sections 142. The printed circuit board 110 may press down against the compliant sections. For example, the connector 106 may be aligned to the upper housing 102 by means of the T sections 142 resting on the comb tool 150 (e.g., prior to a welding or gluing operation).

A tool 152 may implement an alignment tool. The alignment tool 152 is generally operational to provide a mechanical stop for the pins 134a-134n at the position where the printed circuit board 110 may be installed. The alignment tool 152 may include vias similar to the vias 111a-111n of the printed circuit board 110 to receive and align the tips 144 of the pins 134a-134n. The alignment tool 152 may be inserted into the assembly 100 through the open side 120.

Figure 7:
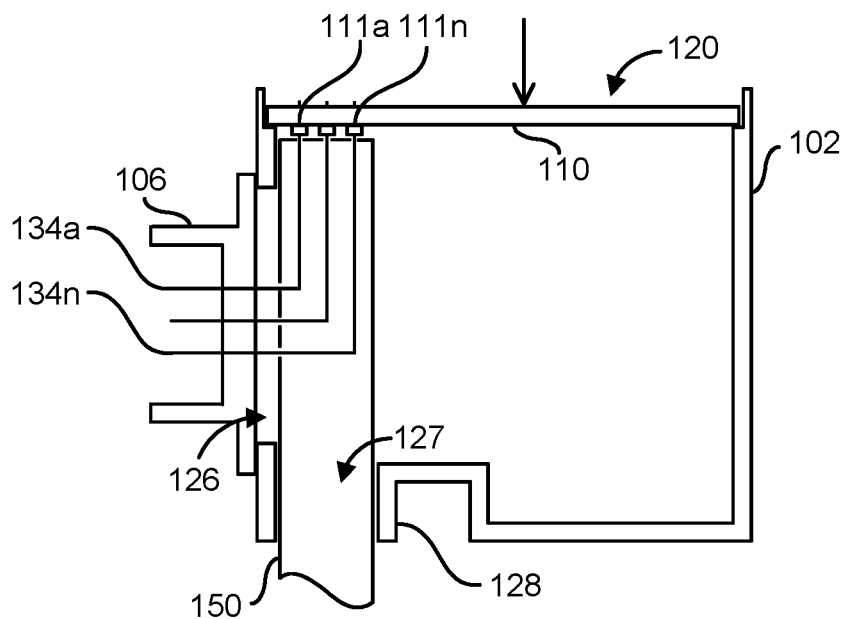
FIG. 7 is a diagram illustrating mating of the pins to the printed circuit board in accordance with an example embodiment of the invention.

Referring to FIG. 7, a diagram illustrating mating of the pins 134a-134n to the printed circuit board 110 is shown in accordance with an example embodiment of the invention. After the connector 106 and the pins 134a-134n have been properly aligned to the upper housing 102, the connector 106 may be permanently attached to the upper housing 102. The attachment may be accomplished by a weld process and/or a glue process.

Once the connector 106 is secured to the upper housing 102, the printed circuit board 110 may be inserted into the upper housing 102 through the open side 120. The tips 144 of the compliant pins 134a-134n may be inserted into the vias 111a-111n of the printed circuit board 110. The comb tool 150 may hold the pins 134a-134n in place while being mated to the printed circuit board 110. In one example, the comb tool 150 may be configured to hold compliant pins during assembly of the printed circuit board 110. Thereafter, the pins 134a-134n may be permanently attached to traces on the printed circuit board 110. The attachment may also be achieved by soldering and/or crimping terminals. Once the pins 134a-134n have been secured to the printed circuit board 110, the comb tool 150 may be withdrawn from the assembly 100.

Figure 8:
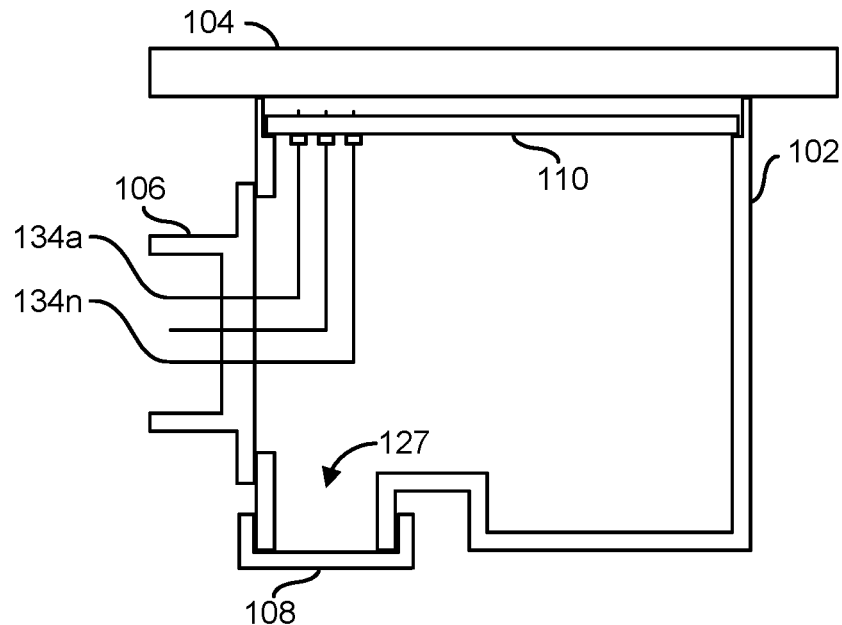
FIG. 8 is a diagram illustrating a cross-sectional view of the apparatus after assembly in accordance with an example embodiment of the invention.

Referring to FIG. 8, a diagram illustrating a cross-sectional view of the apparatus 100 after assembly is shown in accordance with an example embodiment of the invention. With the comb tool 150 withdrawn from the assembly 100, the cap 108 may be secured to the upper assembly 102 to cover the tool opening 127. The cap 108 may be secured by a weld technique and/or a glue technique. The baseplate 104 may be secured to the upper housing 102 to cover the open side 120. The baseplate 104 may be secured by a sealant, tabs and/or fasteners.

Figure 9:
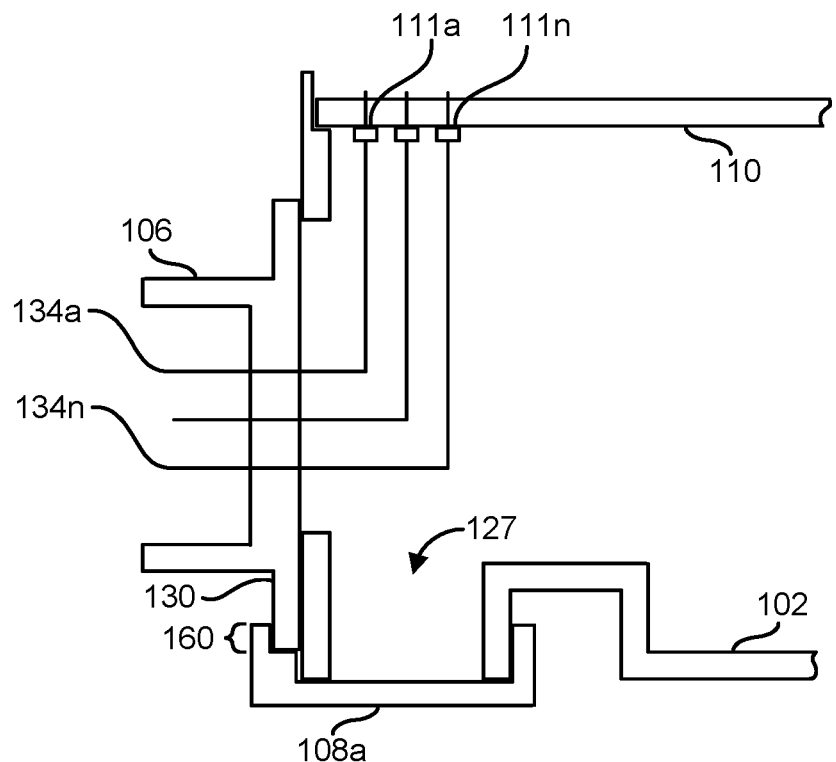
FIG. 9 is a diagram illustrating a cross-sectional view of the apparatus with another cap is shown in accordance with an embodiment of the invention.

Referring to FIG. 9, a diagram illustrating a cross-sectional view of the apparatus 100 with a cap 108a is shown in accordance with an embodiment of the invention. The cap 108a may be a variation of the cap 108. The cap 108a may include a lip that overlaps the flange 130 of the connector 106 a short distance 160. The overlap generally provides mechanical support to hold the connector 106 to the upper housing 102.

Figure 10:
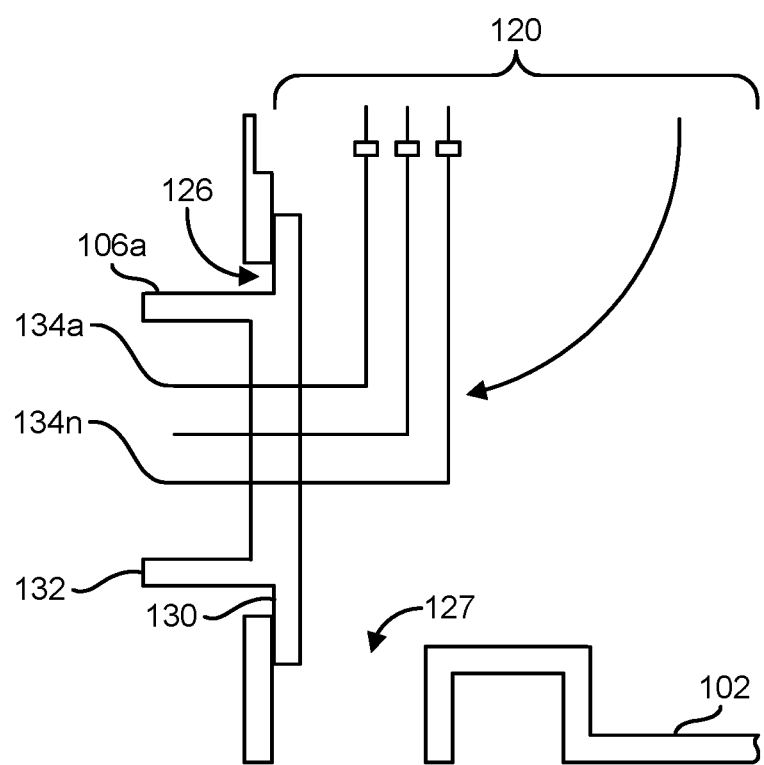
FIG. 10 is a diagram illustrating a cross-sectional view of the apparatus with another connector is shown in accordance with an embodiment of the invention.

Referring to FIG. 10, a diagram illustrating a cross-sectional view of the apparatus 100 with a connector 106a is shown in accordance with an embodiment of the invention. The connector 106a may be a variation of the connector 106. The connector 106a may be configured to be attached to an inside surface of the upper housing 102. The connector 106a with the pins 134a-134n may be inserted into the upper housing 102 through the open side 120. The shroud 132 of the connector 106a may protrude through the connector opening 126 and the flange 130 brought into contact with the inside surface of the upper housing 102. After the connector 106a is aligned with the tools 150-152 (see FIG. 6, the connector 106a may be secured to the upper housing 102 using a weld technique and/or a glue technique).

Figure 11:
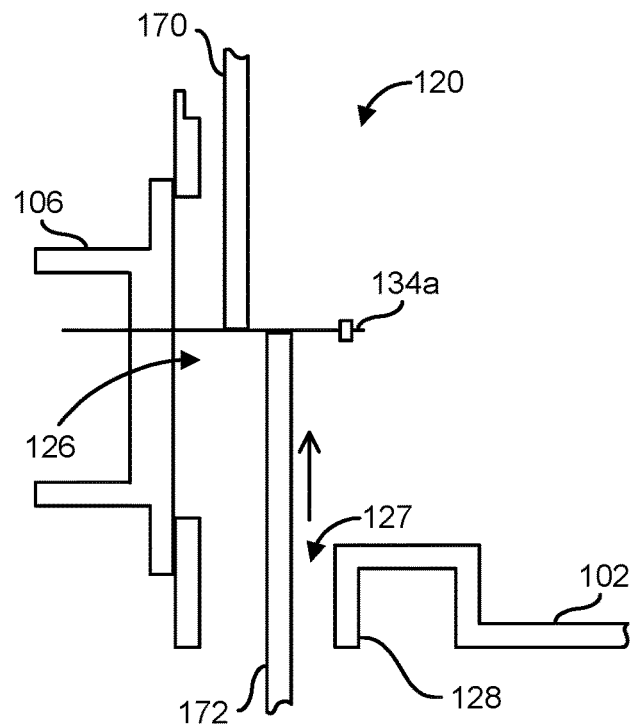
FIG. 11 is a diagram illustrating a technique for bending the pins from inside the upper housing in accordance with an example embodiment of the invention.

Referring to FIG. 11, a diagram illustrating a technique for bending the pins 134a-134n from inside the upper housing 102 is shown in accordance with an example embodiment of the invention. The connector 106 with the pins 134a-134n already sewn may be aligned with the pins 134a-134n extending through the connector opening 126. A pair of bending tools 170-172 may be inserted through the open side 120 and the tool opening 127, respectively, and engage an initial set of pins 134a-134n. In various embodiments, the initial set of pins 134a-134n may be a row of the pins 134a-134n closest to the open side 120. The bending tool 170 may provide a fixed surface against which the initial pins 134a-134n are to be bent. The bending tool 172 may press against the initial pins 134a-134n to start the bending process.

Figure 12:
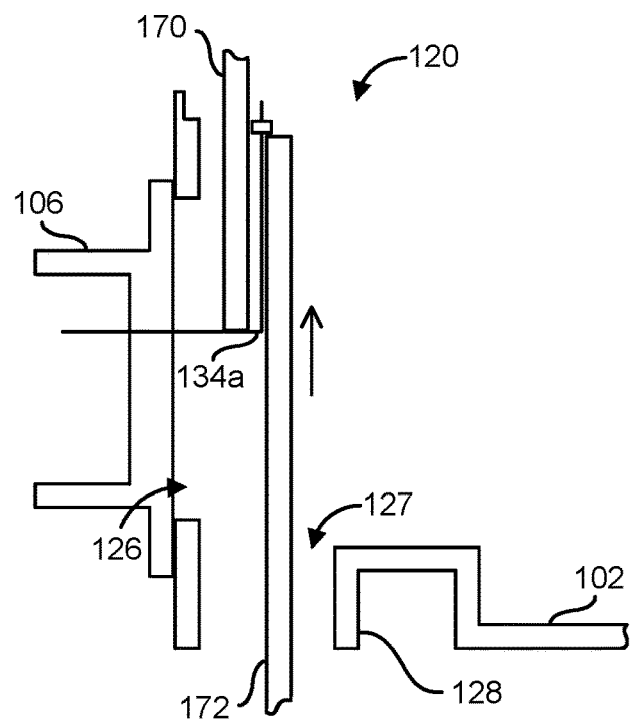
FIG. 12 is a diagram further illustrating the bending technique for the pins in accordance with an example embodiment of the invention.

Referring to FIG. 12, a diagram further illustrating the bending technique for the pins 134a-134n is shown in accordance with an example embodiment of the invention. After the bending tool 172 has engaged the initial set of pins 134a-134n, the bending tool 172 may continue to move toward the open side 120. The initial set of pins 134a-134n may be bent around an edge of the bending tool 170 by the pressure applied by the bending tool 172. The bending tool 172 may stop when the initial pins 134a-134n have achieved a desired shape.

After bending the initial set of pins 134a-134n, the bending tool 172 may be retracted. The bending tool 170 may be aligned and brought into contact with a next set of the pins 134a-134n. In various embodiments, the next set of pins 134a-134n may be a second closest row of the pins 134a-134n to the open side 120. Bending of the next pins 134a-134n may proceed similar to the being of the initial pins 134a-134n. The process may be repeated for each row of pins 134a-134n until all of the pins 134a-134n have been bent.

Figure 13:
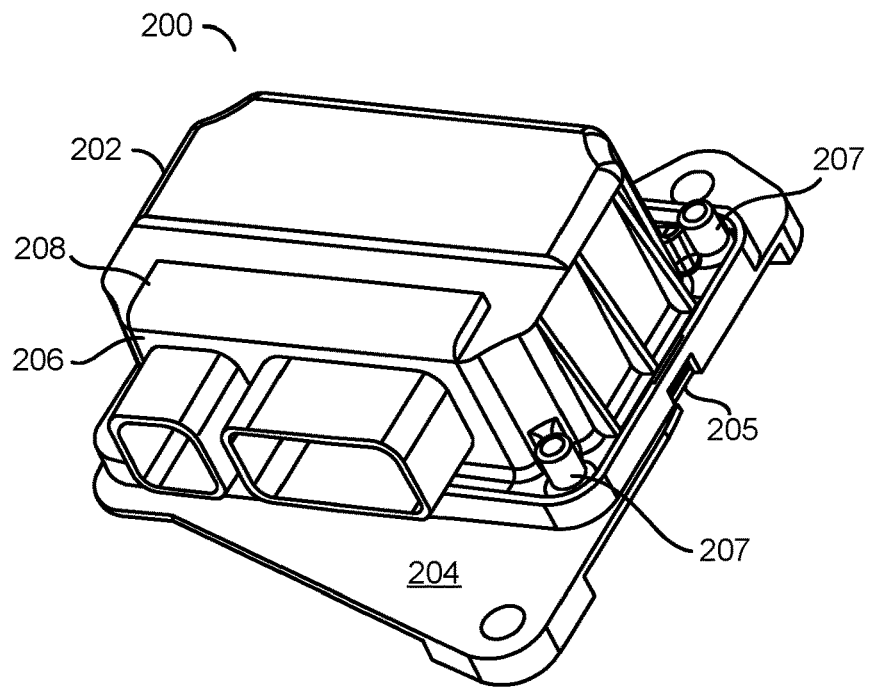
FIG. 13 is a diagram illustrating a perspective view of another apparatus in accordance with an example embodiment of the invention.

Referring to FIG. 13, a diagram illustrating a perspective view of another apparatus 200 is shown in accordance with an example embodiment of the invention. The apparatus 200 may be a variation of the apparatus 100. The apparatus (or module) 200 generally comprises an upper housing 202, a lower housing (or cover or baseplate) 204, a connector 206 and a cap 208. The upper housing 202 may be a variation of the upper housing 102. The baseplate 204 may be a variation of the baseplate 104. The connector 206 may be a variation of the connector 106. The cap 208 may be a variation on the caps 108 and/or 108a. In some variations, the upper housing 202 may include a plurality of optional tabs 205 (one visible in the example shown) distributed around a lower edge of the upper housing 202. In some configurations, the upper housing 202 may also include a plurality of optional sockets 207 (two visible in the example shown) distributed around an external perimeter of the upper housing 202.

The tabs 205 may be configured to engage openings in the lower housing 204 to provide a snap fit that provides a clamping force to a sealant disposed between the upper housing 202 and the lower housing 204. When engaged, the tabs 205 may hold the upper housing 202 and the lower housing 204 in alignment while the sealant cures. In some embodiments, the tabs 205 may be implemented without the sockets 207. In other embodiments, both the tabs 205 and the sockets 207 may be implemented.

The sockets 207 may be configured to receive threaded fasteners (e.g., screws). While the upper housing 202 and the baseplate 204 are aligned to each other, the threaded fasteners may be inserted into holes in the baseplate 204 and secured to threads inside the sockets 207 in the upper housing 202. Alternatively, the threaded fasteners may be inserted into the sockets 207 and secured to threads in the baseplate 204. In some embodiments, the sockets 207 may be implemented without the tabs 205. The threaded fasteners may be tightened before, during or after the upper housing 202 and the baseplate 204 have been compressed together. Once fully tightened, the threaded fasteners may hold the upper housing 202 and the lower housing 204 in alignment while the sealant cures.

Figure 14:
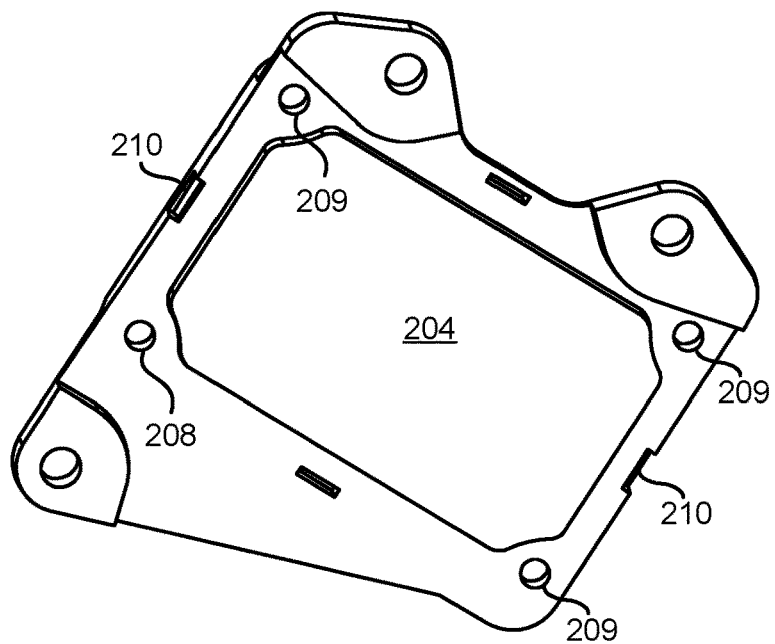
FIG. 14 is a diagram illustrating a perspective view of a baseplate of FIG. 13 in accordance with an example embodiment of the invention.

Referring to FIG. 14, a diagram illustrating a perspective view of the baseplate 204 is shown in accordance with an example embodiment of the invention. The baseplate 204 generally comprises a plurality of optional sockets 209 and a plurality of optional openings 210. The sockets 209 are generally implemented in configurations where the upper housing 202 includes the sockets 207. The openings 210 may be implemented in a configuration where the upper housing 202 includes the tabs 205.

The sockets 209 may be configured to receive the threaded fasteners (e.g., screws) used to securely assemble the upper housing 202 to the baseplate 204. In some embodiments, the sockets 209 may include threads to secure the threaded fasteners inserted through the sockets 207 of the upper housing 202. In other embodiments, the sockets 209 may be smooth bores that allow the threaded fasteners to pass through and screw into the sockets 207 of the upper housing 202.

Figure 15:
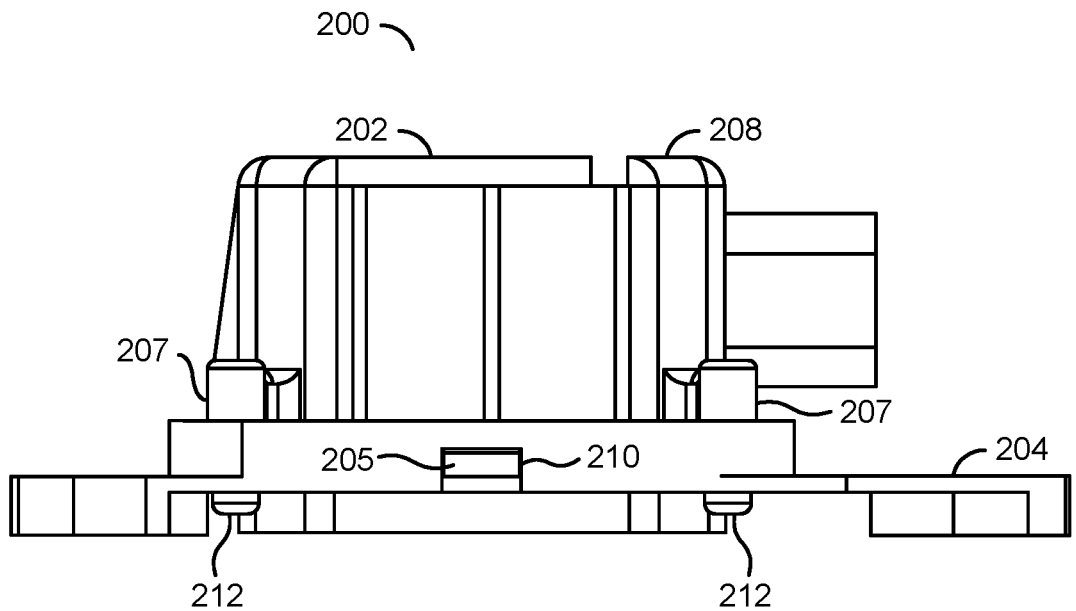
FIG. 15 is a diagram illustrating a side view of the assembled apparatus of FIG. 13 in accordance with an example embodiment of the invention.

Referring to FIG. 15, a diagram illustrating a side view of the assembled apparatus 200 is shown in accordance with an example embodiment of the invention. When the upper housing 202 is assembled to the baseplate 204, the tabs 205 of the upper housing 202 (where implemented) may engage the openings 210 of the baseplate 204 to provide the snap fit that retains the upper housing 202 to the baseplate 204. The threaded fasteners 212 (where implemented) may be used to secure the upper housing 202 to the baseplate 204.

A predefined amount of torque may be applied to the threaded fasteners 212 to perfect a desired clamping force between the upper housing 202 to the baseplate 204. In an example, the threaded fasteners 212 may be tightened (torqued) to provide a clamping force of 67 N per screw. Other amounts of torque may be applied to meet the design criteria of a particular application.

Figure 16:
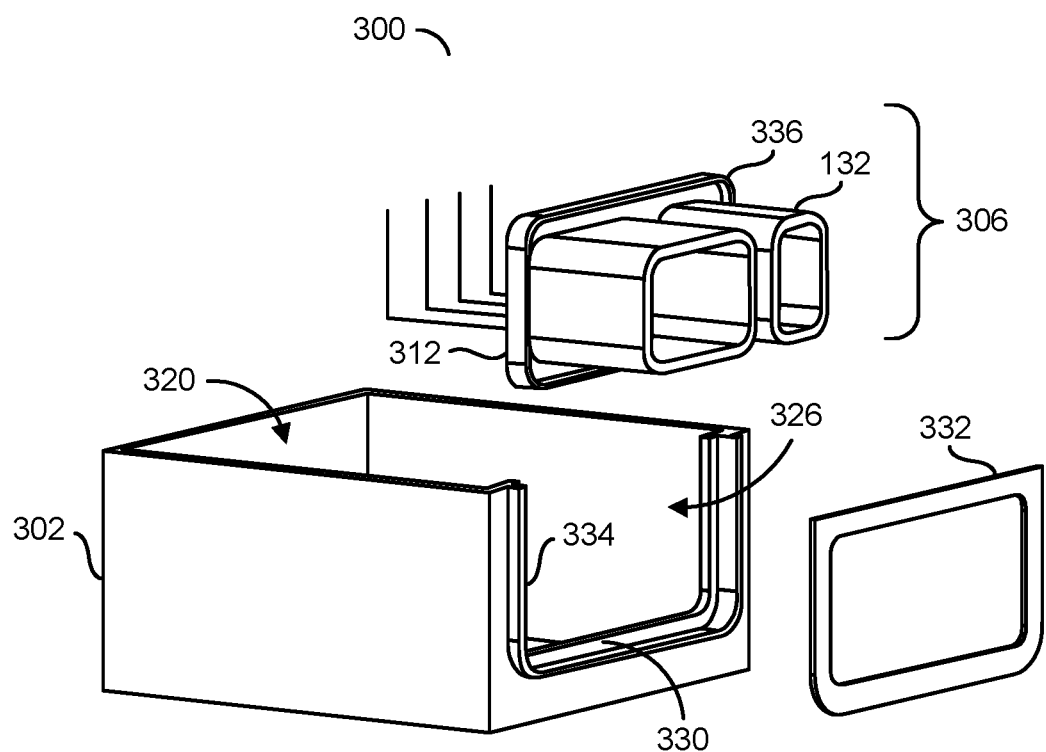
FIG. 16 is a diagram illustrating a portion of yet another apparatus in accordance with an example embodiment of the invention.

Referring to FIG. 16, a diagram illustrating an implementation of a portion of an apparatus 300 is shown in accordance with an example embodiment of the invention. The apparatus 300 may be a variation of the apparatus 100 and/or the apparatus 200. The apparatus (or module) 300 generally comprises an upper housing 302, a lower housing or cover or baseplate (not shown), a connector 306, a cap 308 (see FIG. 18) and a weld ring (or part) 332.

The upper housing 302 may be a variation of the upper housing 102 and/or the upper housing 202. In some variations, the upper housing 302 may include an open side 320, a connector opening 326, an interface 330, a housing weld rib 334, the shelf 122 (not shown) and the flange 124 (not shown). The open side 320 may be a variation of the open side 120. The connector opening 326 may be a variation of the connector opening 126. The interface 330 may be shaped to receive a plate 312 of the connector 306. In various embodiments, the upper housing 302 may include the tabs 205 and/or the sockets 207 (illustrated in FIG. 13).

The connector 306 may be a variation of the connectors 106, 106a and/or 206. The connector 306 generally comprises the pins 134a-134n and the plate 312. The plate 312 may be a variation of the plate 112. The plate 312 may include a connector weld rib 336. In various embodiments, the plate 312 may be formed integral to the connector 306 to form a sealed surface. In other embodiments, the plate 312 may be formed separate from the connector 306 and subsequently joined together.

The open connector side 326 may have the interface 330 shaped to receive the plate 312 of the connector 306. In various embodiments, the plate 312 of the connector 306 may be configured to completely cover the connector opening 326 of the upper housing 302.

The weld ring 332 may be configured to pass around the connector 306 and physically connect to the housing weld rib 334 and the connector weld rib 336. The weld ring 332 may be attached to the weld ribs 334 and 336 after the connector 306 has been positioned in the upper housing 302. The upper housing 302 may support the plate 312 when welding forces are applied during a welding process.

The housing weld rib 334 may face outward from the upper housing 302. The housing weld rib 334 may follow a perimeter along all sides of the interface 330. The housing weld rib 334 is generally configured to be welded to the weld ring 332.

The connector weld rib 336 may be formed around a perimeter of the plate 312. The connector rib 336 may face away from the upper housing 302. The connector weld rib 336 is generally configured to be welded to the weld ring 332.

Figure 17:
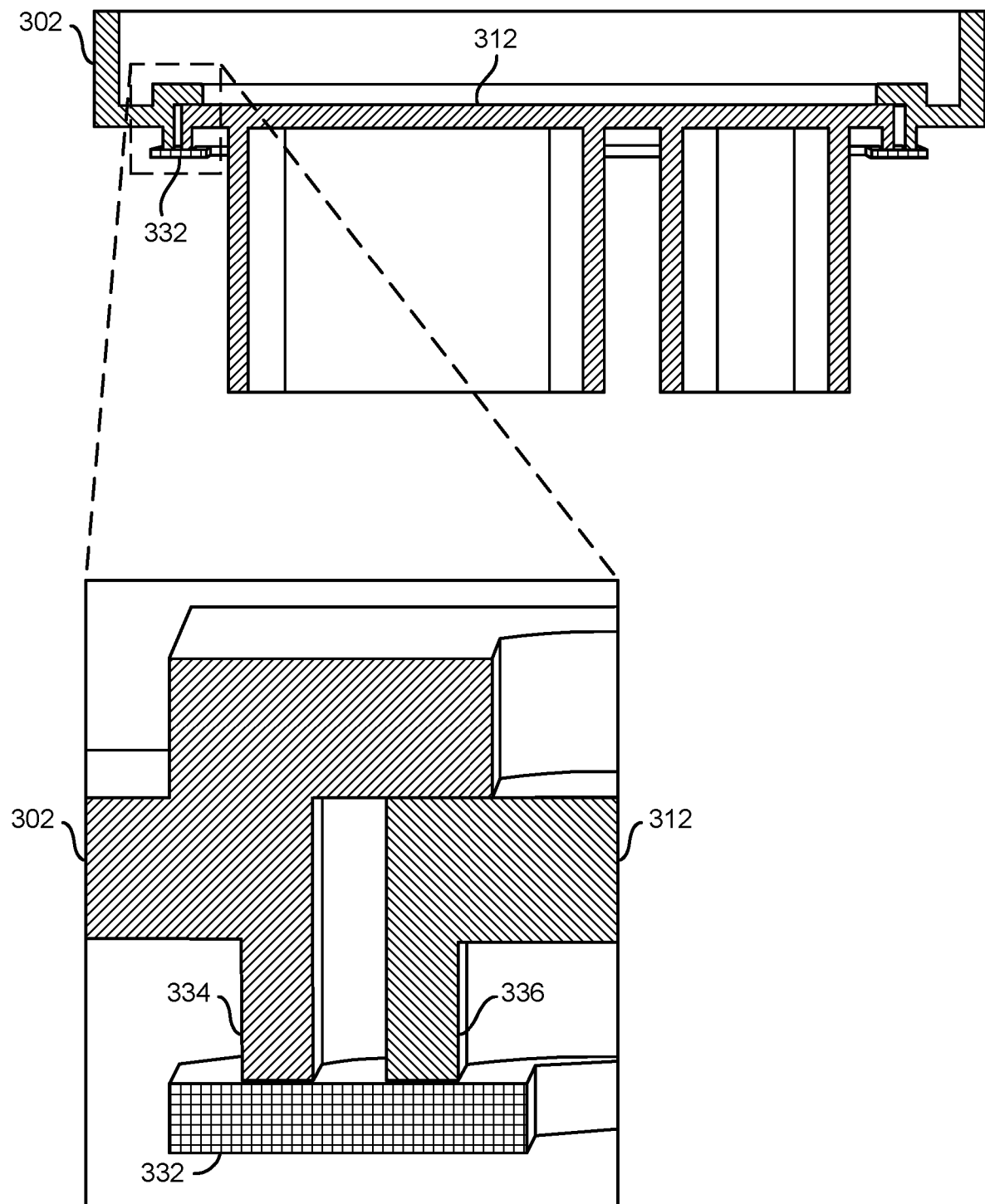
FIG. 17 is a diagram illustrating a cross-sectional view of a portion of the apparatus of FIG. 16 in accordance with an example embodiment of the invention.

Referring to FIG. 17, a diagram illustrating a cross-sectional view of a portion of the apparatus 300 is shown in accordance with an example embodiment of the invention. The plate 312 may be disposed in the interface 330 (FIG. 16) of the upper housing 302. The weld ring 332 may be in physical contact with the weld ribs 334-336.

The weld ring 332 and weld ribs 334-336 generally eliminate any relative motion between the upper housing 302 and the plate 312 during the welding process. During the welding process, only the weld rib 334 on the upper housing 302 and the weld rib 336 on the plate 312 may melt, and so only the weld ring 332 and the weld ribs 334-336 may move. Since a welding laser light only passes through the weld ring 332, the plate 312 may be made of a material that does not readily allow transmission of the welding laser light.

Figure 18:
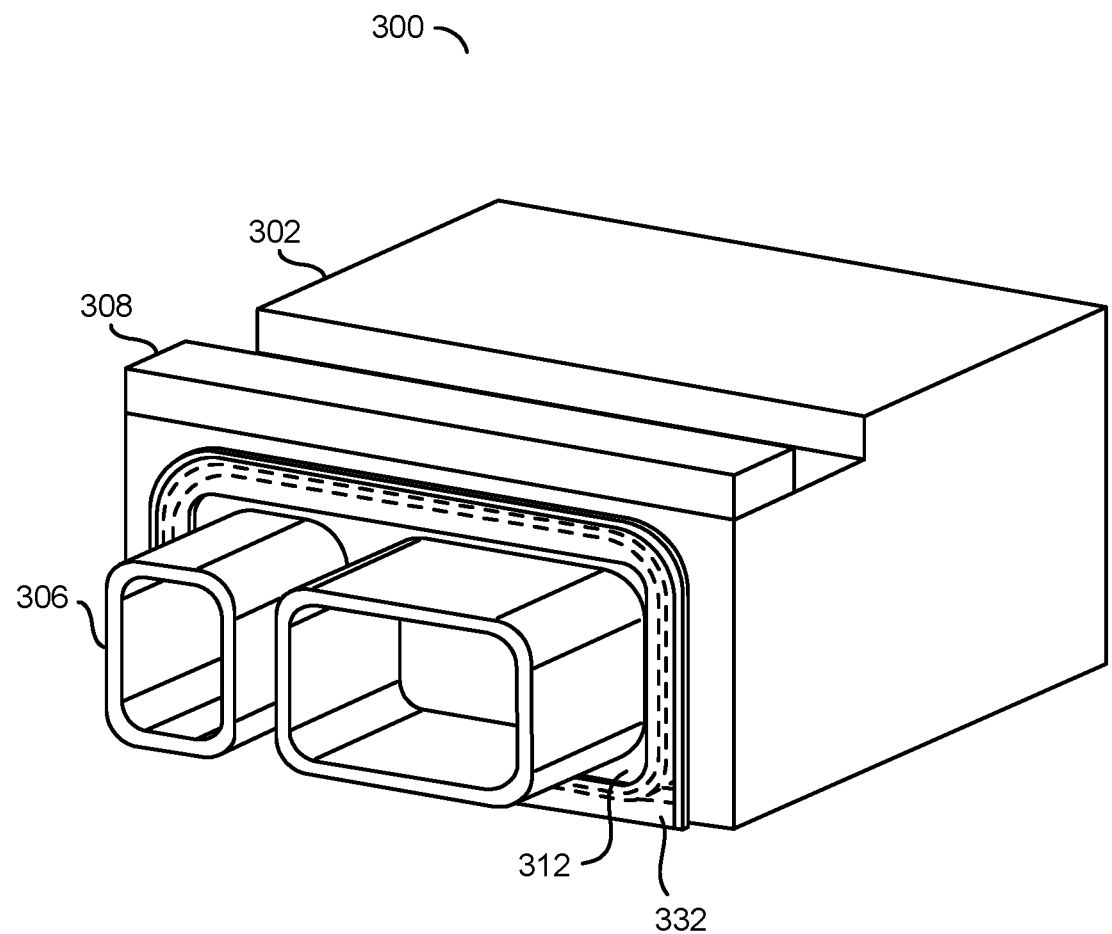
FIG. 18 is a diagram illustrating a perspective view of a portion of the apparatus of FIG. 16 after assembly in accordance with an example embodiment of the invention.

Referring to FIG. 18, a diagram illustrating a perspective view of a portion of the apparatus 300 after assembly is shown in accordance with an example embodiment of the invention. The cap 308 may be a variation of the caps 108, 108a and/or 208. The weld ring 332 may provide a permanent connection between the plate 312 and the upper housing 302.

The weld ring 332 and the weld ribs 334-336 may provide a structurally robust interface between the upper housing 302 and the connector 306. Aside from the weld ribs 334-336, no other motion may be experienced by the upper housing 302 and the connector 306. Once welded in place, the weld ring 332 generally seals the connector 306 to the upper housing 302. If an unsealed version of the assembly 300 is designed, the weld ring 332 may be omitted without the loss of any functionality.

Figure 19:
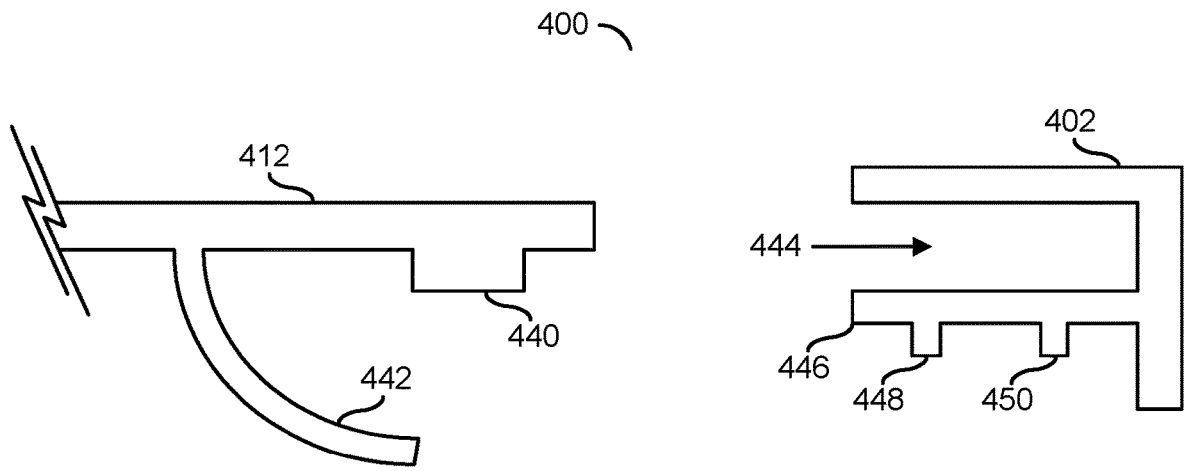
FIG. 19 is a diagram illustrating a part of another apparatus in accordance with an example embodiment of the invention.

Referring to FIG. 19, a diagram illustrating a part of another apparatus 400 is shown in accordance with an example embodiment of the invention. The apparatus 400 may be a variation of the apparatus 100, the apparatus 200 and/or the apparatus 300. The apparatus (or module) 400 generally includes an upper housing 402, the connector (not shown), the baseplate (not shown) and the cap (not shown). The upper housing 402 may be a variation of the upper housings 102, 202 and/or 302. The connector may be a variation of the connectors 106, 106a, 206 and/or 306. The connector may include a plate 412. The plate 412 may be a variation of the plates 112 and/or 312. The apparatus 400 generally illustrates a spring loaded design that may have a flexible feature to provide a tight fit between the upper housing 402 and the plate 412. In various embodiments, the upper housing 402 may be laser opaque. In other embodiments, the upper housing 402 may be laser translucent.

The plate 412 generally includes a tab 440 and a flexible member 442. The tab 440 and the flexible member 442 may extend around the sides of the plate 412 that contact the upper housing 402.

The upper housing 402 generally comprises a groove (or slot) 444, a corner 446, an optional ridge 448 and another optional ridge 450. The groove 444, the corner 446, the ridge 448 and the ridge 450 may extend around the sides of the upper housing that contact the plate 412. The groove 444 may be shaped such that the tab 440 of the plate 412 may be inserted into the groove 444.

Figure 20:
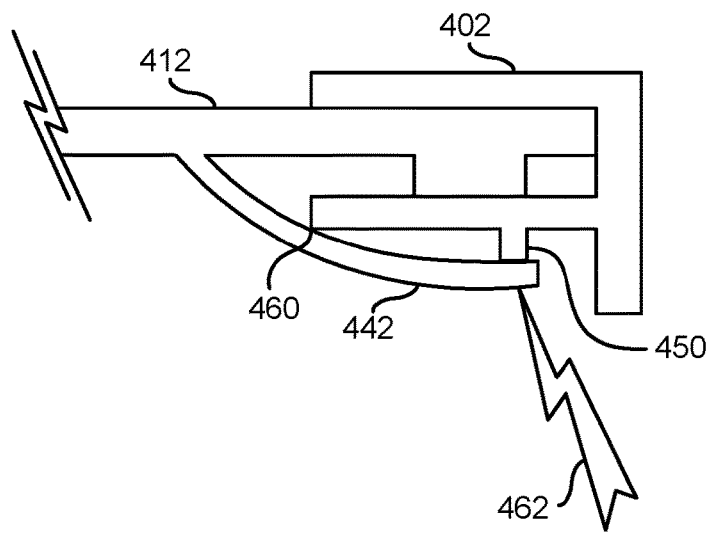
FIG. 20 is a diagram illustrating a spring loaded weld in accordance with an example embodiment of the invention.

Referring to FIG. 20, a diagram illustrating a spring loaded weld is shown in accordance with an example embodiment of the invention. The spring loaded design of FIG. 20 generally has the tab 442 of the plate 412 inserted into the groove 444 along the sides of the upper housing 402.

In some embodiments, the design illustrated may not include the ridge 448. A free end of the flexible member 442 may normally extend away from the ridge 450 (shown), and if implemented, the ridge 448 (not shown). The flexible member 442 may be bent until contact is made with the ridge 450. While bent, the flexible member 442 may also press against the corner 446 to provide a pre-load (or interference) point 460. The pre-load point 460 generally provides a tight fit between the plate 412 and the upper housing 402. A welding laser light 462 may be used to weld the flexible member 442 to the ridge 450 of the upper housing 402. The welding laser light 462 may be directed through the flexible member 442. The resulting weld may meet the sealing criteria between the components 402 and 412 and may increase a mechanical retention.

Figure 21:
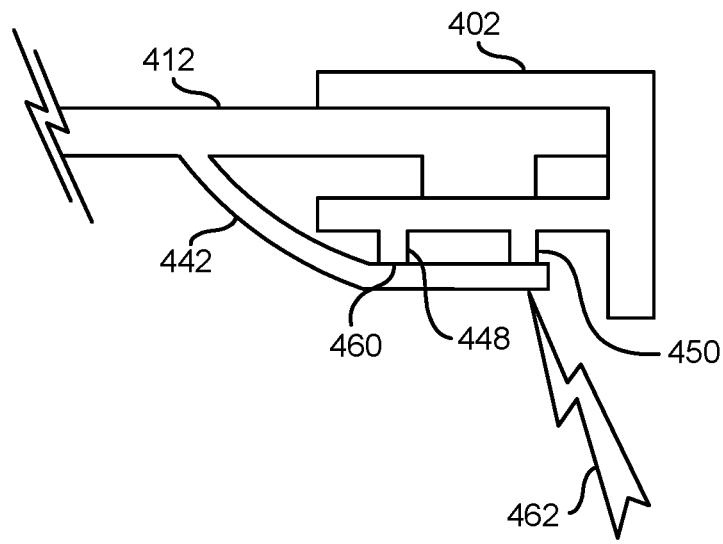
FIG. 21 is a diagram illustrating another spring loaded weld in accordance with an example embodiment of the invention.

Referring to FIG. 21, a diagram illustrating another spring loaded weld is shown in accordance with an example embodiment of the invention. The spring loaded design of FIG. 21 generally has the tab 442 of the plate 412 inserted into the groove 444 along the sides of the upper housing 402. The free end of the flexible member 442 may normally extend away from the ridge 448 and the ridge 450. The flexible member 442 may be bent until contact is made with the ridge 448 and the ridge 450. While bent, the flexible member 442 may press against the ridge 448 to provide the pre-load point 460. The welding laser light 462 may be used to weld the flexible member 442 to the ridge 450. The welding laser light 462 may be directed through the flexible member 442. The resulting weld may meet the sealing criteria between the components 402 and 412 and may increase the mechanical retention.

Figure 22:
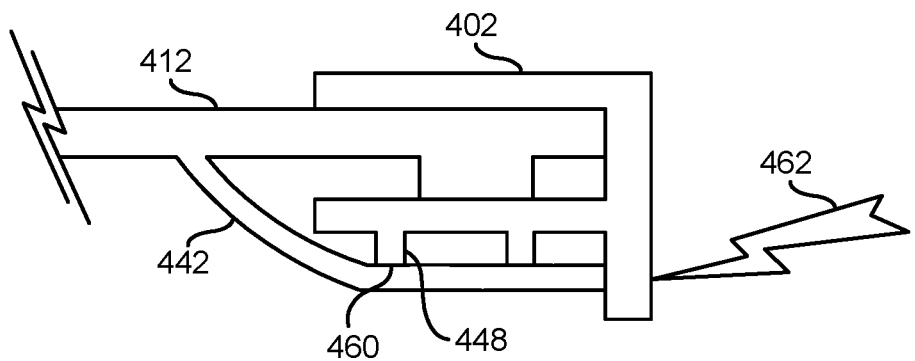
FIG. 22 is a diagram illustrating yet another spring loaded weld in accordance with an example embodiment of the invention.

Referring to FIG. 22, a diagram illustrating yet another spring loaded weld is shown in accordance with an example embodiment of the invention. The spring loaded design of FIG. 22 generally has the tab 442 of the plate 412 inserted into the groove 444 along the sides of the upper housing 402. In some embodiments, the design illustrated may not include the ridge 450. The free end of the flexible member 442 may normally extend away from the ridge 448, and if implemented, the ridge 450. The flexible member 442 may be bent until contact is made with the ridge 448 and an outside edge of the upper housing 402. While bent, the flexible member 442 may press against the ridge 448 to provide the pre-load point 460. The welding laser light 462 may be used to weld the flexible member 442 to the outside edge of the upper housing 402. The welding laser light 462 may be directed through the upper housing 402. The resulting weld may satisfy the sealing criteria between the components 402 and 412 and may increase the mechanical retention.

Figure 23:
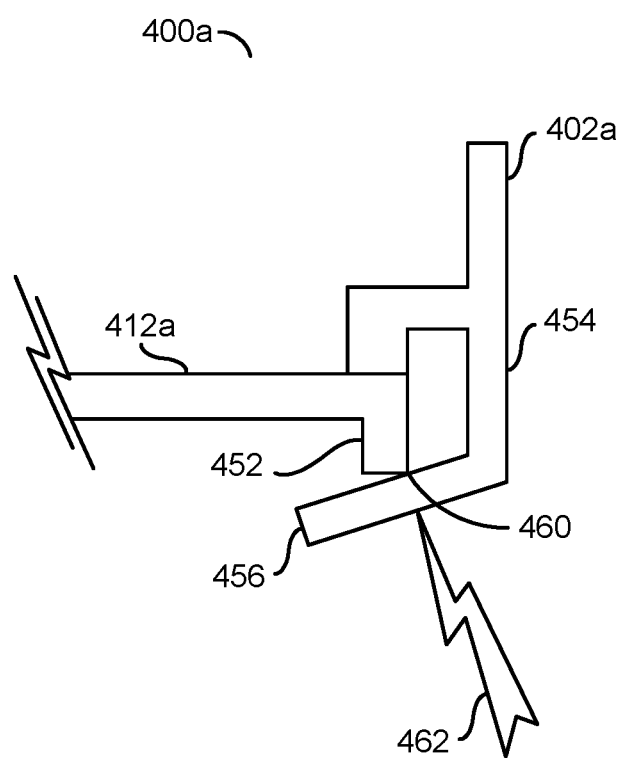
FIG. 23 is a diagram illustrating a part of still another apparatus in accordance with an example embodiment of the invention.

Referring to FIG. 23, a diagram illustrating a part of an apparatus 400a is shown in accordance with an example embodiment of the invention. The apparatus 400a may be a variation of the apparatus 100, the apparatus 200, the apparatus 300 and/or the apparatus 400. The apparatus (or module) 400a generally includes an upper housing 402a, the connector (not shown), a cap (not shown) and the baseplate (not shown). The upper housing 402a may be a variation of the upper housings 102, 202, 302 and/or 402. The connector may be a variation of the connectors 106, 106a, 206 and/or 306. The connector may include a plate 412a. The plate 412a may be a variation of the plates 112, 312 and/or 412. The apparatus 400a generally illustrates a spring loaded design that may have a flexible feature on the upper housing 402a to provide a tight fit between the upper housing 402a and the plate 412a. In various embodiments, the upper housing 402a may be laser translucent.

The plate 412a generally includes ridge 452. The ridge 452 may extend around the sides of the plate 412a that contact the upper housing 402a. The upper housing 402a generally comprises the groove 444 (see FIG. 19), a flange 454, and a beam 456. The groove 444, the flange 454 and the beam 456 may extend around the three sides of the upper housing 402a that contact the plate 412a. The groove 444 may be shaped such that the ridge 452 of the plate 412a may be inserted into the groove 444.

With the plate 412a and the ridge 452 mated to the upper housing 402a, a free end of the beam 456 may be bent by the ridge 452 away from the plate 412a. While bent, the beam 456 may press against a corner of the ridge 452 to provide the pre-load (or interference) point 460. The pre-load point 460 generally provides a tight fit between the plate 412a and the upper housing 402a. The welding laser light 462 may be used to weld the beam 456 to the ridge 452. The welding laser light 462 may be directed through the beam 456. The resulting weld may meet the sealing criteria between the components 402a and 412a and may increase the mechanical retention.

The pre-loading designs generally eliminate relative motion between the connector and the upper housing. The pre-loading designs may provide a structurally robust interface between the upper housing and the connector. In various embodiments, the only function of the weld may be for sealing. If an unsealed version of the module is desired, the weld process may be omitted.

The apparatus 100/200/300/400/400a generally provides several advantages over conventional designs. In particular, screws may not be needed in the apparatus, so steps performed to seal around corresponding screw pockets may not be needed. Furthermore, metal inserts may not be adapted in the upper housing for the screws. Mechanical fastening of the printed circuit board to the upper housing may be made by the sealant. The assembly may pass IP67 testing and higher sealing criteria.

If the fasteners are implemented to hold the upper housing and the baseplate together during the lifetime of the assembly, the fasteners may be included outboard the sealed area. The fasteners may include, but are not limited to, the tabs and the openings, the screws and/or a press-fit design for complete assembly.

Since the baseplate may be made of an electrically conductive material (e.g., metal), the electromagnetic compatibility (EMC) performance of the apparatus may be enhanced. The combined connectors/plate may be welded to the upper housing, thereby forming a sealed module and keeping the connectors in place. The assembly method may also be used to weld or adhere a plastic-type baseplate to the upper housing.

The design and assembly techniques of the apparatus 100/200/300/400/400a may have advantages of being cost effective and improving on the performance of the module (with respect to sealing, mechanical transfer function, and EMC performance). The welding/gluing of the connector to the upper housing may avoid dispensing the sealant at the connector plate to housing interface. Larger part and assembly tolerances may be allowed since the dispensed sealant may absorb component variations. Furthermore, a single sealant dispensing operation may be implemented to seal the entire module.

A metal-type baseplate may provide an enhanced mechanical transfer function (MTF) compared with ECU designs with plastic housings and plastic covers. The apparatus may have a lower cost than similar housings where the connector is over-molded in the housing. An increased area for electronic components on the printed circuit board may be provided since no fasteners are going through the printed circuit board or through the interior of the enclosure.

The assembly method may also enable a simpler assembly line, since the connectors may be fully sealed to the upper housing when attached to the upper housing. The welding/gluing of the connector to the upper housing may provide a robust seal between upper housing and the connectors and plate. The final apparatus may be mechanically strong since the connectors and plate may now be structural components when welded/glued to the upper housing.

The functions and structures illustrated in the diagrams of FIGS. 1-23 may be designed, modeled, emulated, and/or simulated using one or more of a conventional general purpose processor, digital computer, microprocessor, microcontroller, distributed computer resources and/or similar computational machines, programmed according to the teachings of the present specification, as will be apparent to those skilled in the relevant art(s). Appropriate software, firmware, coding, routines, instructions, opcodes, microcode, and/or program modules may readily be prepared by skilled programmers based on the teachings of the present disclosure, as will also be apparent to those skilled in the relevant art(s). The software is generally embodied in a medium or several media, for example non-transitory storage media, and may be executed by one or more of the processors sequentially or in parallel.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element. While the invention has been particularly shown and described with reference to embodiments thereof, it will be understood by those skilled in the art that various changes in form and details may be made without departing from the scope of the invention.

The invention claimed is:

1. An apparatus comprising:
a housing having a first opening, a second opening and a third opening;
a connector comprising a shroud, a plate, a weld rib, and one or more pins, wherein said plate is configured to seal said first opening of said housing, and said connector is sealed to said housing using said weld rib and a weld ring;
a circuit board (i) disposed inside said housing and (ii) having one or more vias configured to receive said one or more pins, wherein (a) said second opening is configured to allow said circuit board to be inserted into said housing, (b) said third opening is configured to receive a comb tool that presses said one or more pins into said one or more vias and (c) said comb tool is removed from said third opening after said one or more pins are disposed in said one or more vias; and
a cap configured to seal said third opening.

2. The apparatus according to claim 1, wherein said housing, said connector and said circuit board form an electronic control unit.

3. The apparatus according to claim 1, further comprising a baseplate configured to seal said second opening.

4. The apparatus according to claim 3, further comprising one or more fasteners configured to secure said housing to said baseplate outside of said second opening.

5. The apparatus according to claim 1, wherein said plate of said connector is sealed to an outside surface of said housing.

6. The apparatus according to claim 1, wherein said plate of said connector is sealed to an inside surface of said housing.

7. The apparatus according to claim 1, wherein said cap does not overlap said plate of said connector.

8. The apparatus according to claim 1, wherein said cap overlaps said plate of said connector.

9. The apparatus according to claim 1, wherein (i) said plate of said connector is aligned to said first opening of said housing with said comb tool and an alignment tool while being sealed to said housing and (ii) said alignment tool is received through said second opening of said housing.

10. The apparatus according to claim 1, wherein (i) said housing further comprises a shelf and a flange and (ii) said circuit board is disposed on said shelf and inside said flange to align said vias with said pins.

11. A method for assembling a capped electronic control unit, comprising the steps of:
assembling a connector comprising a shroud, a plate, a weld rib, and one or more pins to a housing, wherein said connector is inserted into a first opening of said housing, and is sealed to said housing using said weld rib and a weld ring;
inserting a circuit board into said housing through a second opening of said housing, wherein said circuit board has one or more vias configured to receive said one or more pins;
inserting a comb tool in a third opening of said housing, wherein said comb tool provides support to said one or more pins during insertion into said one or more vias;
pressing said pins into said one or more vias with said one or more pins supported by said comb tool;
removing said comb tool from said third opening after said one or more pins are disposed in said one or more vias; and
sealing said third opening of said housing with a cap.

12. The method according to claim 11, further comprising the step of:
sealing said second opening with a baseplate.

13. The method according to claim 12, further comprising the step of:
securing said housing to said baseplate outside of said second opening.

14. The method according to claim 11, wherein said plate of said connector is sealed to an outside surface of said housing.

15. The method according to claim 11, wherein said plate of said connector is sealed to an inside surface of said housing.

16. The method according to claim 11, wherein said cap does not overlap said plate of said connector.

17. The method according to claim 11, wherein said cap overlaps said plate of said connector.

18. The method according to claim 11, wherein (i) said plate of said connector is aligned to said first opening of said housing with said comb tool and an alignment tool while being sealed to said housing and (ii) said alignment tool is received through said second opening of said housing.

19. An apparatus comprising:
a housing having a first opening, a second opening, and a third opening;
a connector comprising a shroud, a plate, and one or more pins, wherein said plate comprises a flexible member and a tab configured to be attached to said housing such that (i) said tab of said plate fits within a slot of said housing and (ii) said flexible member of said plate is bent to contact one or more ridges of said housing and welded to said housing to seal said first opening of said housing;
a circuit board (i) disposed inside said housing and (ii) having one or more vias configured to receive said one or more pins, wherein (a) said second opening is configured to allow said circuit board to be inserted into said housing, (b) said third opening is configured to receive a comb tool that presses said one or more pins into said one or more vias and (c) said comb tool is removed from said third opening after said one or more pins are disposed in said one or more vias; and
a cap configured to seal said third opening.

20. The apparatus according to claim 19, wherein said flexible member of said plate is laser welded to at least one ridge of said housing.

* * * * *